US008158506B2

(12) United States Patent
Kim et al.

(10) Patent No.: US 8,158,506 B2
(45) Date of Patent: Apr. 17, 2012

(54) METHODS AND DESIGNS FOR LOCALIZED WAFER THINNING

(75) Inventors: Suku Kim, South Jordan, UT (US); James J. Murphy, South Jordan, UT (US); Michael D. Gruenhagen, Sandy, UT (US); Matthew R. Reynolds, Sandy, UT (US); Romel N. Manatad, Mandaue (PH); Jan Vincent C. Mancelita, Mandaue (PH)

(73) Assignee: Fairchild Semiconductor Corporation, San Jose, CA (US)

( * ) Notice: Subject to any disclaimer, the term of this patent is extended or adjusted under 35 U.S.C. 154(b) by 455 days.

(21) Appl. No.: 12/115,254

(22) Filed: May 5, 2008

(65) Prior Publication Data

US 2009/0273082 A1    Nov. 5, 2009

(51) Int. Cl.
H01L 21/44    (2006.01)
(52) U.S. Cl. .................................. 438/613; 257/739
(58) Field of Classification Search .................. 257/739; 438/613
See application file for complete search history.

(56) References Cited

U.S. PATENT DOCUMENTS

| 5,959,346 A * | 9/1999 | Ochiai ........................ 257/618 |
| 6,033,489 A * | 3/2000 | Marchant et al. ............ 148/33.2 |
| 2007/0042549 A1 * | 2/2007 | Zeng ........................... 438/268 |

* cited by examiner

Primary Examiner — Stephen W Smoot
Assistant Examiner — Vicki B Booker
(74) Attorney, Agent, or Firm — Kenneth E. Horton; Kirton|McConkie

(57) ABSTRACT

Methods for localized thinning of wafers used in semiconductor devices and the structures formed from such methods are described. The methods thin localized areas of the backside of the semiconductor wafer to form recesses with a bi-directional channel design that is repeated within the wafer (or die) so that no straight channel line crosses the wafer (or die). The bi-directional pattern design keeps the channels from being aligned with the crystal orientation of the wafer. The recesses are then filled by a solder ball drop process by dropping proper size solder balls into the recesses and then annealing the wafer to reflow the solder balls and flatten them out. The reflow process begins to fill in the recesses from the bottom up, thereby avoiding void formation and the resulting air traps in the reflowed solder material. Other embodiments are also described.

18 Claims, 4 Drawing Sheets

ABSTRACT

METHODS AND DESIGNS FOR LOCALIZED WAFER THINNING

FIELD

This application relates generally to semiconductor wafer processing. More specifically, this application discusses methods for localized thinning of wafers and substrates used in semiconductor devices and the structures formed from such methods.

BACKGROUND

As part of semiconductor device processing, a number of discrete devices and integrated circuits ("IC" or "ICs") are formed on a wafer, or substrate, made from a semiconductive material, such as silicon. Generally, discrete devices and ICs are formed with layers of materials that have semiconductive, conductive, and/or insulative properties. These materials are deposited, doped, etched, or otherwise used to form ICs in individual regions on the wafer that are called die or dies. The dies are then diced (separated from each other) and packaged.

Power metal-oxide-semiconductor field-effect transistors (MOSFETs) are one type of semiconductor device. Often, power MOSFETs are used as electrical switches and, when turned on, require the amount on-resistance ($RDS_{on}$) to be minimized for optimum performance. But as the performance requirements for power MOSFETS increase, so does the need to minimize the $RDS_{on}$.

$RDS_{on}$ depends, in part, on the resistance of the semiconductor substrate (typically a silicon wafer) containing the structure of the MOSFET. Some attempts have been made to reduce the substrate resistance by grinding the wafer to reduce its thickness as much as possible. While reducing the thickness reduces the substrate resistance, the minimum thickness that can be obtained by the grinding process is limited by the breakage of the wafer and other manufacturing problems.

Other attempts to reduce the substrate resistance have used localized wafer thinning, typically by forming enclosed holes 5 (as shown in FIG. 1a) or channels 10 (as shown in FIG. 1b) in local areas of the backside 15 of the wafer 20. But the enclosed hole design of FIG. 1a can require additional processing to avoid the air traps that can be formed when refilling the holes with a desired material. As well, the enclosed hole design can require front-back alignment for conventional saw process used in dicing because the conductive material in the holes can hinder the sawing action.

The channel design of FIG. 1b also has some drawbacks that limit its adoption. With this design, the wafer strength is significantly lower because of long cleavage line that runs across wafer or die, making the wafer or die prone to cleavage or breakage. As well, with this design, the wafer can warp along the channel direction. And higher magnitude and non-uniformity in the wafer warp is often expected with this design.

SUMMARY

This application relates to methods for localized thinning of wafers used in semiconductor devices and the structures formed from such methods. The methods thin localized areas of the backside of the semiconductor wafer to form recesses with a bi-directional channel design that is repeated within the wafer (or die) so that no straight channel line crosses the wafer (or die). The bi-directional pattern design keeps the channels from being aligned with the crystal orientation of the wafer and any device structure, e.g. line trenches, in the active region. This can reduce wafer (or die) fracture/chipping/cleavage since certain crystal orientations of the wafer or some device structures in the active region can be prone to fracture/chipping/cleavage. The recesses are then filled by a solder ball drop process by dropping proper size solder balls into the recesses and then annealing the wafer to reflow the solder balls and flatten them out. The reflow process begins to fill in the recesses from the bottom up, thereby avoiding void formation and the resulting air traps in the reflowed solder material.

BRIEF DESCRIPTION OF THE DRAWINGS

The following description can be better understood in light of the Figures, in which.

Figure 1A:
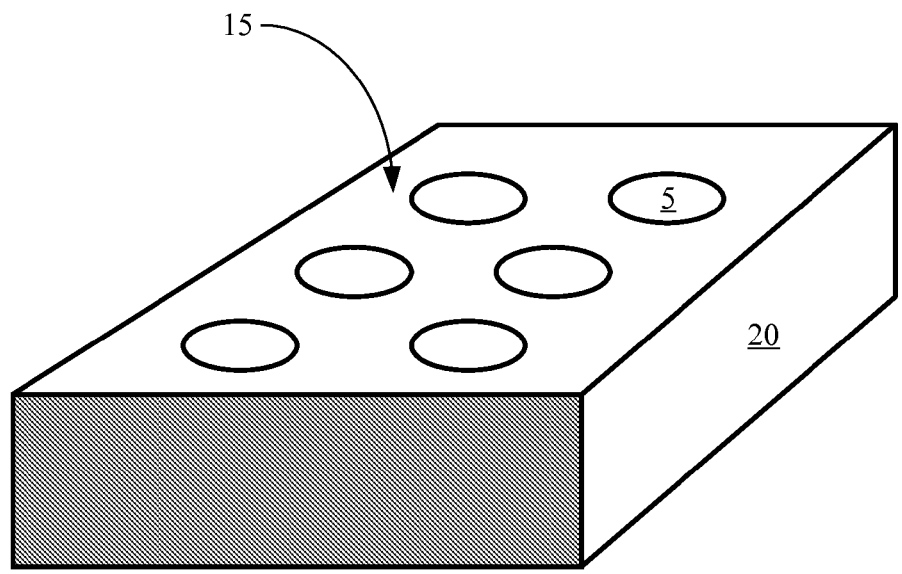
FIGS. 1a and 1b show conventional localized wafer thinning designs.

The Figures illustrate specific aspects of the methods for localized thinning of a semiconductor wafer and the structures formed using such methods. Together with the following description, the Figures demonstrate and explain the principles of the methods and structures produced through these methods. In the drawings, the thickness of layers and regions are exaggerated for clarity. It will also be understood that when a layer, component, or substrate is referred to as being "on" another layer, component, or substrate, it can be directly on the other layer, component, or substrate, or intervening layers may also be present. The same reference numerals in different drawings represent the same element, and thus their descriptions will not be repeated.

DETAILED DESCRIPTION

The following description supplies specific details in order to provide a thorough understanding. Nevertheless, the skilled artisan would understand that the devices and associated methods of using the devices can be implemented and used without employing these specific details. Indeed, the devices and associated methods can be placed into practice by modifying the illustrated devices and associated methods and can be used in conjunction with any other apparatus and techniques conventionally used in the industry. For example, while the description below focuses on methods for making for semiconductor devices in the discrete power device and IC industry, it could be used for and applied to other electronic devices like optoelectronic devices, solar cells, MEMS structures, as well as sensors, laser devices, and detectors that contain a semiconductor wafer.

Figure 2A:
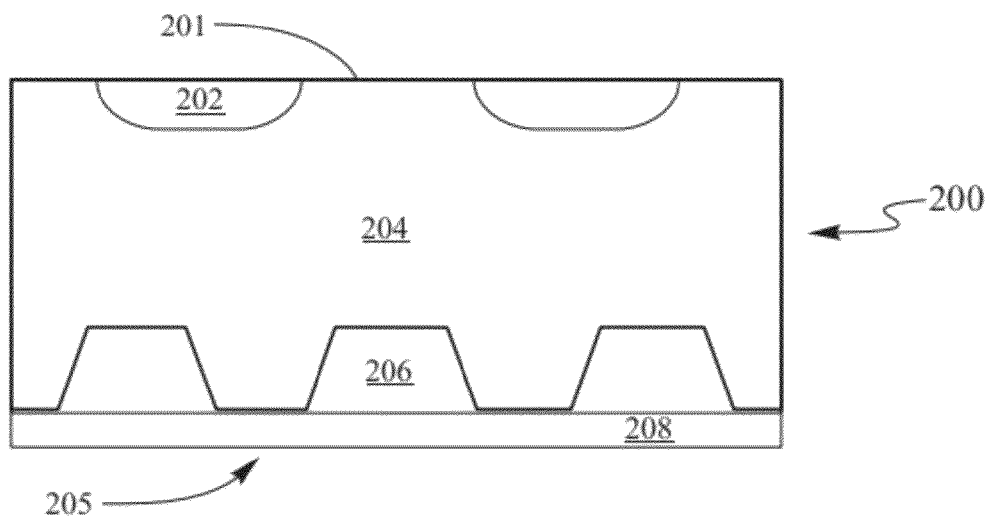
FIG. 2A illustrates a side view and FIG. 2B illustrates a perspective view of the structures formed in some embodiments of the methods for localized wafer thinning.
Figure 2B:
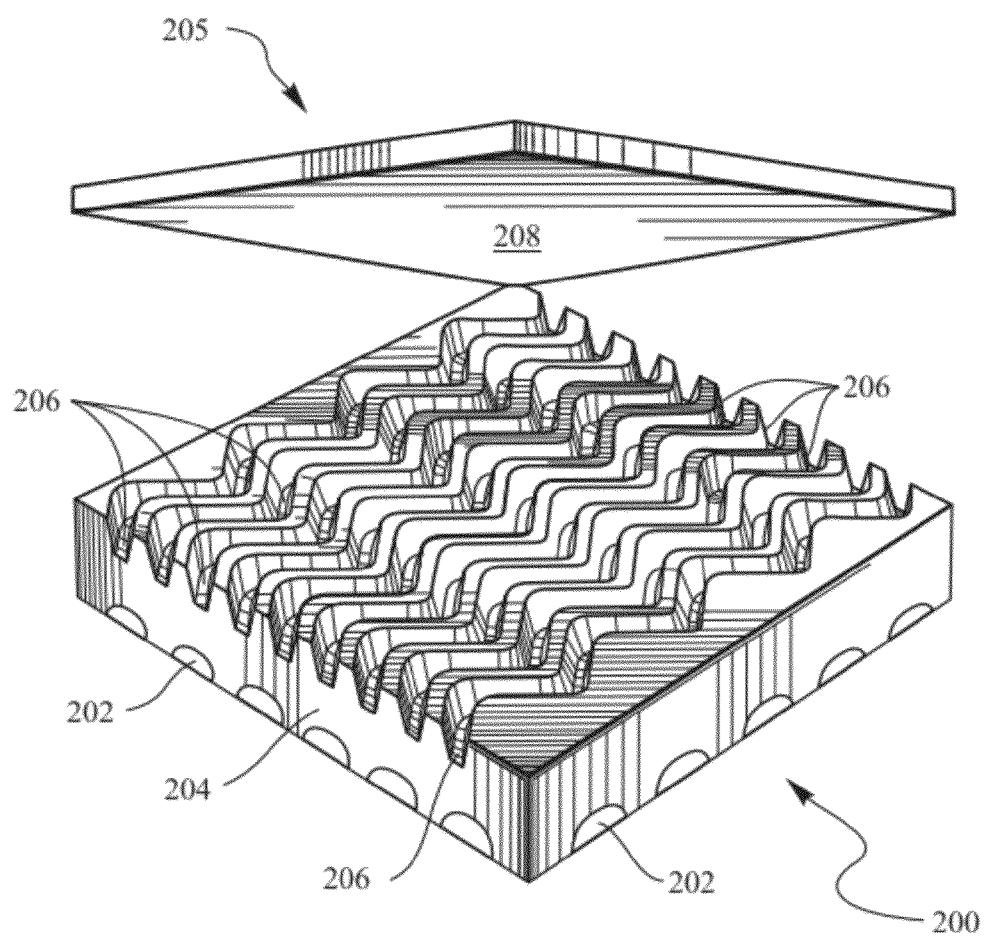
Figure 3A:
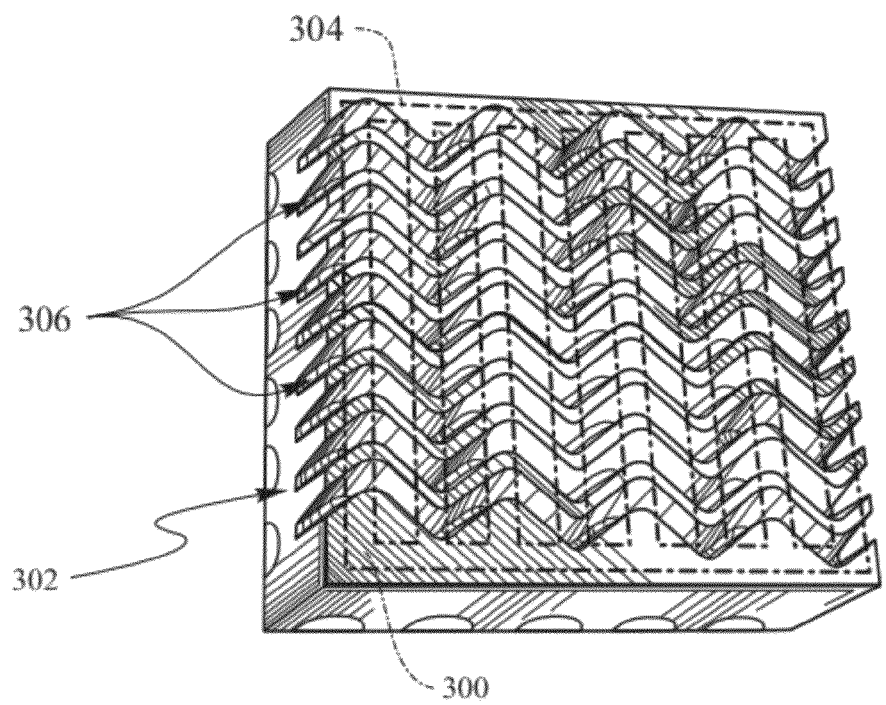
FIGS. 3A and 3B depict bi-directional channel designs used in some embodiments of the methods for localized wafer thinning.
Figure 3B:
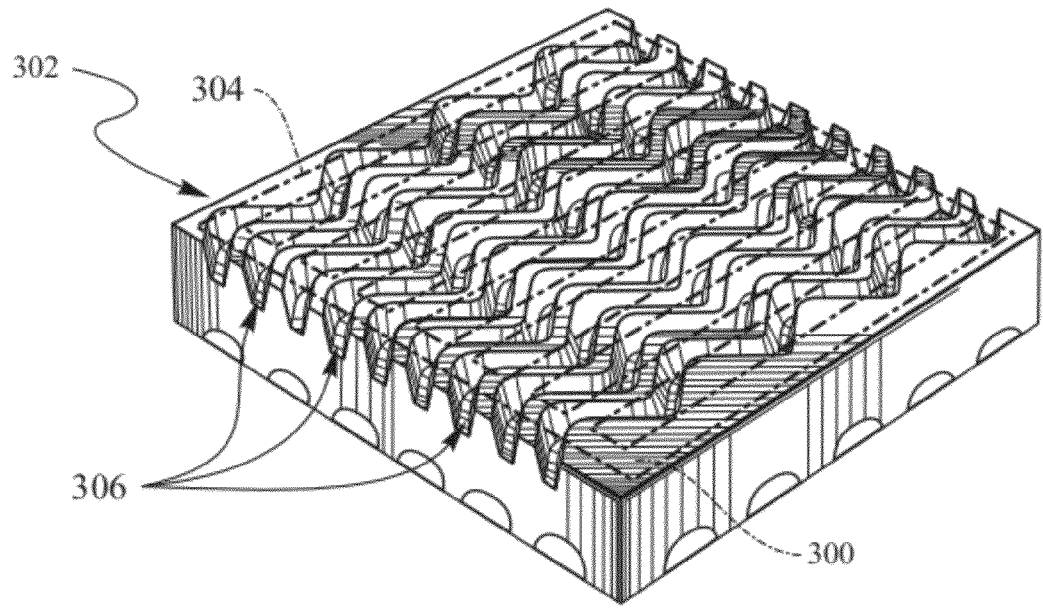
Figure 4:
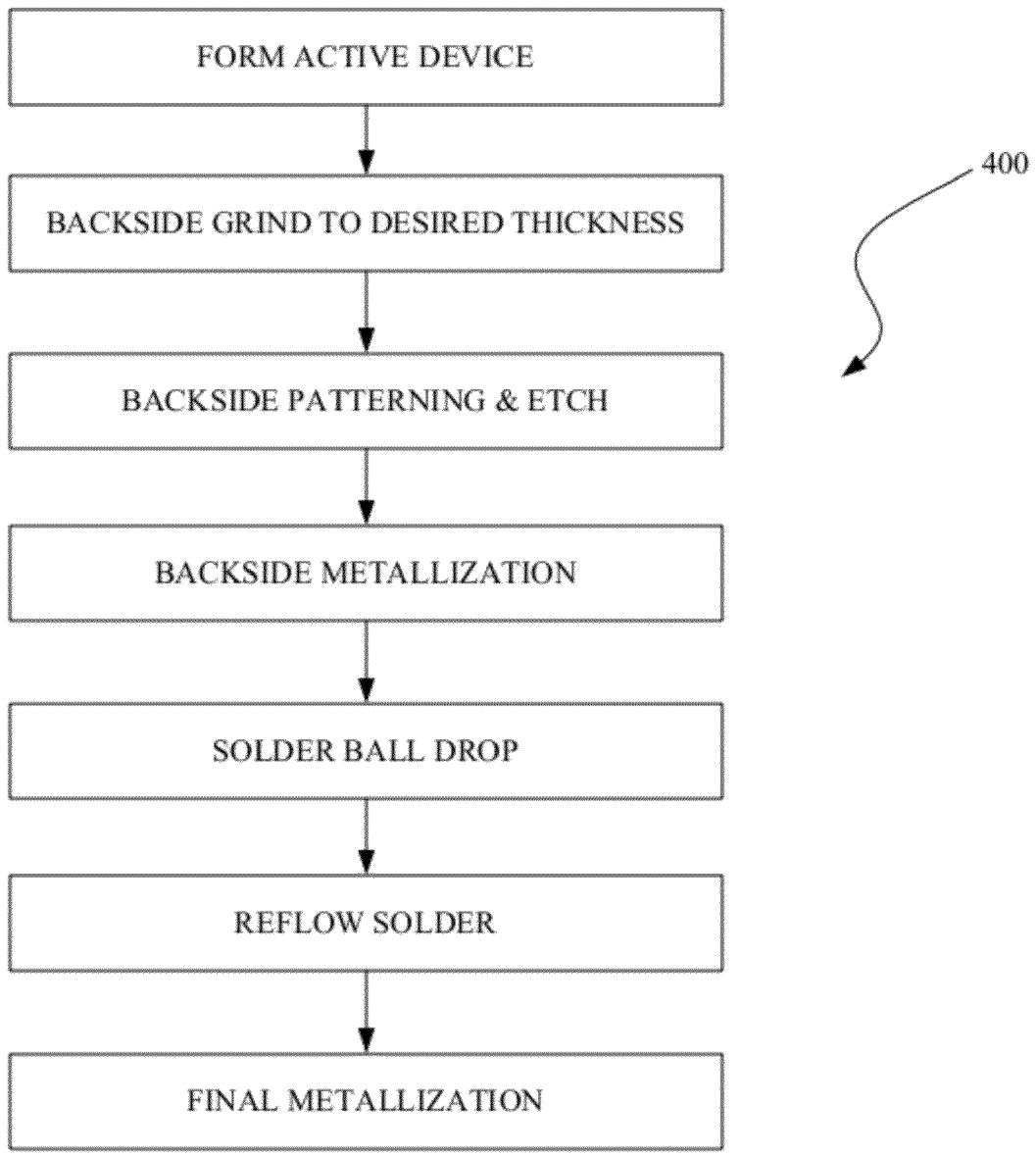
FIG. 4 shows some embodiments of the methods for localized wafer thinning.

Some embodiments of the methods for localized thinning of a semiconductor wafer and the structures formed using such methods are shown in FIGS. 2-4. In the embodiments shown in FIG. 2A and FIG. 2B, a semiconductor device 200 having a low substrate resistivity is shown. The substrate 200 can be either a wafer or a die. The semiconductor device 200 illustrated includes a plurality of active device regions 202 formed in a first surface 201 of a semiconductor substrate 204. An electrical contact layer 208 is provided on a second surface (or backside) 205 of the semiconductor substrate 204.

Moreover, an array of recesses 206 is located in the substrate 204 and are connected to the electrical contact layer 208.

The active regions 202 can be any known active region in a semiconductor device. In some embodiments, the active regions comprise discrete power devices, including MOSFET devices, insulated gate bipolar transistor devices, diodes, or thyristors. In other embodiments, the active regions comprise power MOSFETs.

In some embodiments, some or all of the recesses 206 can contain a material having an electrical resistivity lower than an electrical resistivity of the material of the semiconductor substrate 204, thereby lowering the effective electrical resistivity of the substrate. Examples of the materials that can be contained in the recesses 206 include solder materials, conductive epoxy, metals (whether plated or deposited), or heavily doped semiconductors. Optionally, a barrier layer (such as a thin layer of titanium) may be deposited to line the recesses 206 and extend along the backside of the substrate 204 as known in the art.

The array of recesses 206 are configured so that there will be one or more recesses on the backside of each die when that die is diced from the wafer. In some embodiments, the recess array can be aligned with respect to the pattern of the active regions 202 on the front surface of the water. This arrangement allows the substrate 200 to be sliced into individual dies containing the desired active regions that would be consistent for subsequent processing.

The recesses 206 do not extend all the way through the substrate 204. Instead, a desired thickness of the substrate 200 remains between the bottom of recesses and the bottom of the active regions. In some embodiments (such as where there exists a 200 μm thick substrate after the wafer grinding), this thickness can range from about 10 to 150 microns. In other embodiments (such as where there exists a 400 μm thick substrate after the wafer grinding), this thickness can range from about 10 to about 350 microns.

The recesses 206 can have various geometries depending on the warp and/or bow of the target wafer, the active front device structures, desired packaging processes, and the desired current flow to the active regions 202. In some embodiments, such as those illustrated in FIG. 2A and FIG. 2B, the recesses can have a truncated pyramidal shape. In other embodiments, the recesses can have a pyramidal shape. In yet other embodiments, the recesses can have trenches with a vertical wall, trenches with a rounded corner or semi-circle, or any other similar shape. The angle between the substantially planar backside 205 and the sidewall of the recesses can range from about 20 to about 120 degrees.

The depth of the recesses depends on the substrate thickness after wafer grinding and the target $RDS_{on}$. In some embodiments (such as where there exists a 200 μm thick substrate after the wafer grinding), the depth of the recesses can range from about 50 to about 190 μm. In other embodiments (such as where there exists a 400 μm thick substrate after the wafer grinding), the depth of the recesses can range from about 50 to about 390 μm.

Figure 1B:
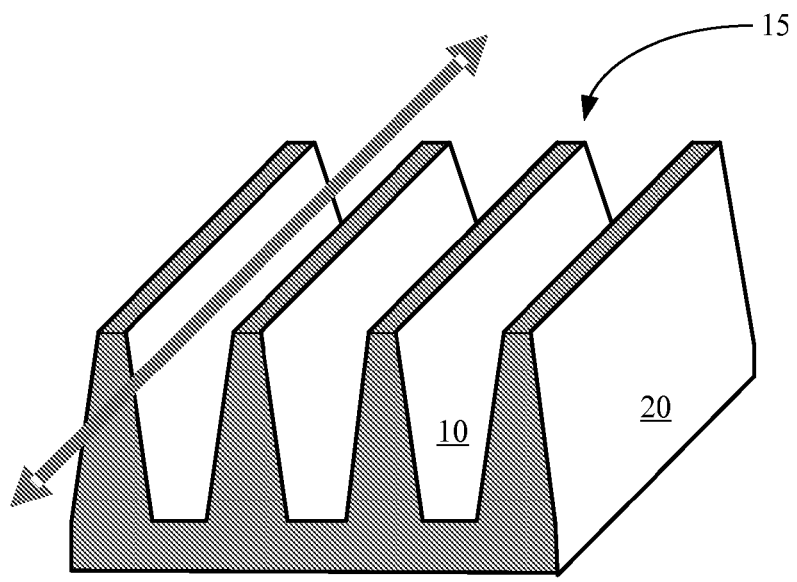

The array of recesses also has a bi-directional design or a design where the recess extends in more than a single direction or orientation. The bi-directional design includes any configuration of the recesses that forms a channel across the wafer (or die) so that discrete holes (as shown in FIG. 1a) are not formed. The channel(s) may be partially or completely continuous. As well, the bi-directional design may or may not be repeated within the wafer (or die). Finally, the bi-directional design has a configuration where no straight or linear channel completely crosses the wafer/die (as shown in FIG. 1b), thereby keeping the channels from being completely aligned with the crystal orientations of the wafer or any device structure (e.g., line trenches) in the active region.

The bi-directional design can have any configuration matching these criteria. Thus, the partial or complete channels can be any combination of straight, curved, obtuse, or acute directions, or even combinations of these directions. The channels can be oriented in any number of directions, including two, three, four, or even more directions, and such multiple orientations would be considered a bi-directional design.

The orientation of the channels can change as desired. In some embodiments, the orientation between one channel and an adjacent channel can range from about 1 to about 170 degree since it can be an acute, vertical, or obtuse angle. In other embodiments, the orientation between one channel and an adjacent channel can range from about 1 to about 90 degrees. And the change in orientation can occur suddenly or gradually.

In some embodiments, the bi-directional design or orientation of the channels is illustrated in FIGS. 3A and 3B. In FIGS. 3A and 3B, the front side of a die 300 is shown with some active region structures (i.e., line trenches) which, when looking through the substrate, would be substantially similar to the crystal orientation. The crystal orientation the material of the substrate (i.e., silicon) and certain device structures in the active region (i.e., line trenches) are shown by the lines 304. The bi-directional design of the recesses 306 is shown transposed over the crystal orientation/active region structures 302. Thus, the channels formed by the recesses 306 can, at times, overlap the crystal orientation and certain device structures in the active regions. Yet at other times, there exists no overlap. In some embodiments, the overlap between the recess channels and the crystal orientation can range from about 1 to about 90%. In other embodiments, the overlap between the recess channels and the crystal orientation can be about 20%.

The semiconductor devices illustrated in FIGS. 2 and 3 can be manufactured by any method known in the art that provides the features described above. In some embodiments, the semiconductor devices are formed by the process 400 illustrated in FIG. 4. This process 400 begins by forming the active regions 202 (i.e., power MOSFETs) using any process known in the art. Optionally, the upper surface 201 of the substrate 200 is then protected as known in the art, e.g., by tape, a photoresist or any other known protection.

Next, the backside 205 of the substrate 200 is ground to a desired thickness. In some embodiments, this thickness is the minimum thickness at which the substrate, without the recesses, can be handled without breakage. This minimum thickness generally ranges from about 20 to about 400 microns depending on the device structures and substrate materials. After the grinding process, the backside 205 of the substrate 200 comprises a substantially planar surface with and without roughened surface since the backside can be typically roughened chemically or mechanically to have larger contact area and better metal adhesion.

Next, the back surface is patterned using any known methods, including photolithography. The patterning process lays down a mask with a pattern corresponding to the areas where recesses will not be formed. Then, an etching process is performed through that mask to etch the material in the substrate in those areas not covered by the mask. The result of this etching process is the formation of the recesses 206.

The different geometries for the recesses 206 can be formed by masking with different materials, changing the etching materials used, and changing the time of the etching process. To form the recesses substantially illustrated in FIGS. 2 and 3, the etching process is performed with an orientation-dependent chemical anisotropic silicon etchant, for example a mixture of KOH, normal propanol, and water. In some instances, the anisotropic etchants have a much slower etch rate on the (111) plane of the substrate relative to the (100) plane. After the recesses have been formed, the mask is then removed using any known method. In other instances, isotropic etching process and etchants can be used to form the recesses. In these instances, HNA (a mixture of HF, $HNO_3$, and $CH_3COOH$) or a combination of HF, $H_3PO_4$, $H_2SO_4$, and $HNO_3$ acids can be used to produce the recess structures with round corners and under-etched below the masks. Also, partially isotropic (or anisotropic) etching process such as RIE (reactive ion etching) or plasma etching can be used to form desired recess structures.

Next, the method continues with a backside metallization process. A metalized back surface may serve several purposes, such as serving as an adhesion and/or barrier layer. The metal layers can be deposited onto the wafer backside by any known method, including sputtering, evaporation, chemical vapor deposition, or plating. The thickness for this metallization can range from about 1000 Å to about 10 μm. The metal may be deposited on part or the entire surface of the backside (within the recess structure and outside of the recess). Some non-limiting examples of the metals than can be used include silver, gold, lead, nickel, platinum, titanium, tin, chromium, and/or combinations thereof.

The process 400 continues by filling in the recesses 206 with the desired materials. In some embodiments, the recesses are filled by a screen printing of epoxy, squeezing epoxy, or direct epoxy printing process. In other embodiments where the fill material comprises solder, the process begins by dropping solder balls into the recesses. The size (and number) of the solder balls are selected with the needed amount of re-fill of the recesses. In some embodiments, the recesses are desired to be completely re-filled and, so, the size and number of solder balls are selected to achieve this goal.

After the solder balls have been dropped into the recesses, they are reflowed. The reflow process can be carried out for a time and temperature sufficient to reflow substantially all of the solder in the balls and will depend on the type of alloy used in the solder. In some embodiments, such as when SAC (Sn/Ag/Cu) solder alloy is used, the reflow process includes a peak temperature of about 240° C., a heat ramp rate of about 0.6 to about 0.75 degrees/second, a liquidus temperature of about 217° C., a time above the liquidus ranging from about 40 to about 45 seconds, and a cool down rate of about −1.6 to about −1.9 degrees/second. During the reflow process, the solder balls reflow and fill in the recesses from the bottom up, thereby ensuring that substantially no voids are formed and substantially no air is trapped within the reflowed solder material.

Once the reflow process is complete, the upper surface of the reflowed solder can be substantially planar with the backside surface of the substrate. In other embodiments, the upper surface of the reflowed solder can be under-filled (i.e., concave or recessed) or even over-filled (i.e., convex or extruding) relative to the backside surface of the substrate.

Next, the method continues at when a material is deposited on the back surface of the wafer. In such embodiments, any material suitable for deposition on the back surface of the wafer can be deposited on the wafer. Some non-limiting examples of suitable materials include a metal (e.g., silver, gold, lead, nickel, platinum, titanium, tin, and/or combinations thereof (e.g., NiPdAu, TiNiAgAu, or TiNiAgSn)), an oxidation-resistant layer, or an adhesion sub-layer. A metallized back surface may serve several purposes, such as improving the electrical and/or mechanical connection between the back surface of the die and another component of a semiconductor package or circuit.

Then, the wafer can be diced into individual dies and the dies are then separated from each another as known in the art. The separated dies can then be used with larger circuits in either a packaged or an unpackaged form. The wafer dicing process can be accomplished in a variety of known processes, including through a scribing, a sawing, or a dicing process.

These methods of making the semiconductor device can offer lower $RDS_{on}$, higher wafer/die strengths, and lower wafer warp. Further, using the bi-directional designs can enhance the wafer strength while at the same time making it easier to fill in the recesses with a desired conductive material like solder. As well, using these bi-directional patterns to form the channels not only eliminates the need for additional processing before being able to fill in the recesses, but also allows standard die attach procedures to be used. And using these methods and the bi-directional design can eliminate the need to use front-back side alignment, lowering cost and improving the manufacturability of making the semiconductor devices.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A method for manufacturing a semiconductor device, comprising:
   providing a semiconductor substrate with an active device in a front surface thereof;
   forming multiple channels in the back surface of the substrate so that the channels do not form discrete holes or extend only in a single direction;
   filling the multiple channels with solder balls; and
   re-flowing the solder balls.

2. The method of claim 1, wherein the active device comprises a MOSFET device.

3. The method of claim 1, wherein the substrate comprises a wafer or a die.

4. The method of claim 1, including forming the channels by patterning and etching the back surface of the substrate.

5. The method of claim 1, wherein the bi-directional design of the channels are partially or completely continuous across the back surface of the substrate.

6. The method of claim 1, wherein the channels include a channel running from one side of the substrate to another side of the substrate.

7. The method of claim 1, wherein the channels do not contain a straight channel extending completely across the back surface.

8. The method of claim 1, wherein the channels are oriented in two or more directions and include multiple channels running from one side of the substrate to another side of the substrate.

9. The method of claim 1, wherein the size of the solder balls is selected so that the recesses are substantially filled, under-filled, or over-filled with solder material after the reflow process.

10. A method for manufacturing a semiconductor device, comprising:
providing a semiconductor substrate with a MOSFET in a front surface thereof;
grinding the back surface of the substrate;
forming multiple channels in the back surface of the substrate so that the channels do not form discrete holes and are not completely aligned with the crystal orientation of the substrate;
filling the multiple channels with solder balls; and
re-flowing the solder balls.

11. The method of claim 10, including forming the channels by patterning and etching the back surface of the substrate.

12. The method of claim 10, wherein the channels are partially or completely continuous across the back surface of the substrate.

13. The method of claim 10, wherein the channels include a channel running from one side of the substrate to another side of the substrate.

14. The method of claim 10, wherein the channels do not contain a straight channel extending completely across the back surface.

15. The method of claim 10, wherein the channels are oriented in two or more directions and include multiple channels running from one side of the substrate to another side of the substrate.

16. The method of claim 10, wherein the size of the solder balls is selected so that the recesses are substantially filled, under-filled, or over-filled with solder material after the reflow process.

17. A method for manufacturing a semiconductor device, comprising:
providing a semiconductor substrate with an active device in a front surface thereof;
forming multiple channels in the back surface of the substrate so that the channels extend in a linear direction without forming discrete holes;
filling the multiple channels with solder balls; and
re-flowing the solder balls.

18. The method of claim 17, wherein the channels are oriented in two or more directions and include multiple channels running from one side of the substrate to another side of the substrate.

* * * * *